US009319799B2

(12) United States Patent
Salmon

(10) Patent No.: US 9,319,799 B2
(45) Date of Patent: Apr. 19, 2016

(54) MICROPHONE PACKAGE WITH INTEGRATED SUBSTRATE

(71) Applicant: Robert Bosch GmbH, Stuttgart (DE)

(72) Inventor: Jay Salmon, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 180 days.

(21) Appl. No.: 13/971,382

(22) Filed: Aug. 20, 2013

(65) Prior Publication Data

US 2014/0264654 A1    Sep. 18, 2014

Related U.S. Application Data

(60) Provisional application No. 61/782,569, filed on Mar. 14, 2013.

(51) Int. Cl.
*H04R 25/00* (2006.01)
*H04R 9/08* (2006.01)
*H04R 11/04* (2006.01)
*H04R 17/02* (2006.01)
*H04R 19/04* (2006.01)
*H04R 21/02* (2006.01)
*H04R 1/28* (2006.01)
*H04R 19/00* (2006.01)
*B81C 1/00* (2006.01)
*H04R 1/00* (2006.01)

(52) U.S. Cl.
CPC ............ *H04R 19/04* (2013.01); *B81C 1/00309* (2013.01); *H04R 1/2846* (2013.01); *H04R 19/005* (2013.01); *B81B 2201/0257* (2013.01); *B81C 2203/0118* (2013.01); *H04R 1/00* (2013.01)

(58) Field of Classification Search
CPC ................ B81B 2201/0257; B81C 1/00309; B81C 2203/0118; H04R 19/005; H04R 19/04; H04R 1/2846
USPC .......... 257/416; 381/111, 114, 122, 174, 175, 381/369; 438/51
See application file for complete search history.

(56) References Cited

U.S. PATENT DOCUMENTS

| 4,569,414 | A | * | 2/1986 | Fulton .......................... 181/156 |
| 5,795,815 | A | | 8/1998 | Vokoun et al. |
| 8,030,722 | B1 | | 10/2011 | Bolognia et al. |
| 8,178,936 | B2 | * | 5/2012 | Zhe et al. ...................... 257/416 |
| 8,254,619 | B2 | | 8/2012 | Yeh et al. |
| 2010/0177922 | A1 | | 7/2010 | Park et al. |

(Continued)

FOREIGN PATENT DOCUMENTS

| CN | 2891564 | 4/2007 |
| EP | 2190215 | 5/2010 |

OTHER PUBLICATIONS

International Search Report and Written Opinion for Application No. PCT/US2014/025613 dated Oct. 30, 2014 (20 pages).

(Continued)

*Primary Examiner* — Khai N Nguyen
(74) *Attorney, Agent, or Firm* — Michael Best & Friedrich LLP

(57) ABSTRACT

MEMS microphone packages are described that include an ASIC integrated in the base substrate of the package housing. Methods of manufacturing the same and methods for separating individual microphone packages from wafer form assembly arrays are also described.

6 Claims, 5 Drawing Sheets

(56) References Cited

U.S. PATENT DOCUMENTS

| | | |
|---|---|---|
| 2010/0183181 A1 | 7/2010 | Wang |
| 2010/0295138 A1* | 11/2010 | Montanya Silvestre et al. .............. 257/415 |
| 2011/0222717 A1* | 9/2011 | Kuratani et al. .............. 381/355 |
| 2012/0087521 A1* | 4/2012 | Delaus et al. ................. 381/174 |
| 2012/0235256 A1 | 9/2012 | Zoellin et al. |
| 2012/0300969 A1* | 11/2012 | Tanaka et al. ................. 381/355 |
| 2012/0313222 A1* | 12/2012 | Lee et al. ...................... 257/620 |
| 2013/0050227 A1* | 2/2013 | Petersen et al. ............... 345/501 |

OTHER PUBLICATIONS

Salvatti A et al: "Maximizing Performance From Loudspeaker Ports", Journal of The Audio Engineering Society. Audio Engineering Society. New York, NY, US, vol. 50. No. 1/02. Jan. 1, 2002. pp. 19-45.

S Sullivan et al: "Non-Traditional Dicing of MEMS Devices", NSTI-Nanotech 2008, Jan. 1, 2008. XP055144278. www.nsti.org, Retrieved from the Internet: URL:http://www.nsti.org/publications/Nanotech/2008/pdf/1356.pdf [retrieved on Oct. 3, 2014].

\* cited by examiner

MICROPHONE PACKAGE WITH INTEGRATED SUBSTRATE

RELATED APPLICATIONS

This application claims the benefit of U.S. Provisional Application No. 61/782,569, filed on Mar. 14, 2013 and entitled "INTEGRATED SILICON SUBSTRATE MICROPHONE PACKAGE," the entire contents of which are incorporated herein by reference.

BACKGROUND

The present invention relates to microphone system packages and singulation methods for extracting and separating individual packages from an array of packages in wafer form.

SUMMARY

Some existing microphone packages include a package housing configured to form a cavity within. A MEMS microphone component can be coupled to an interior surface of the base layer of the package housing. An application specific integrated circuit (ASIC) or other control circuit is also mounted to the interior surface of the base layer. The ASIC is configured to communicate electric signals from the MEMS microphone component and to provide some control functionality of the microphone component. The ASIC is formed on a chip that includes mounting hardware and bond pads to provide for electrical and physical interconnect between the ASIC chip and the microphone package housing.

When microphone packages of this type are manufactured in array form (i.e., a plurality of microphone packages formed as a single original wafer and cleaved/separated into individual packages), the base layer of the package (and the ASIC chip itself) must be of a minimum thickness to provide for secure physical support of the MEMS device and the ASIC chip during assembly and separation from wafer form. Furthermore, the package must be designed to provide a sufficient saw street width between the microphone packages.

In some embodiments, the invention provides a MEMS microphone package with an ASIC integrated as part of the silicon substrate base layer. As a result, a separate ASIC chip does not need to be mounted inside the package cavity during manufacture. Furthermore, because the bond pad and other interconnect mechanisms are not required between the substrate base of the microphone and a separate ASIC chip, layout density and overall size of the microphone package are reduced. Substrate thickness is also reduced as compared to die-in-substrate solutions that use a separate ASIC chip as there is no minimum thickness requirement for ASIC handling during lamination into a secondary substrate assembly.

In one embodiment, the invention provides a MEMS microphone package that includes a base substrate layer, a lid, and a MEMS microphone component positioned within a package cavity. The base substrate layer includes an acoustic port opening configured to allow acoustic pressures to reach the MEMS microphone component inside the package cavity. An application specific integrated circuit is formed as an integrated part of the base substrate layer. The MEMS microphone component is electrically coupled to the application specific integrated circuit of the base substrate layer.

In another embodiment, the invention provides a method of forming a plurality of MEMS microphone packages. A silicon substrate base layer is provided and a silicon substrate spacer layer is coupled to the base layer. A silicon substrate lid layer is coupled to the spacer layer opposite the base layer. The spacer layer has been etched to form an array of microphone package cavities. A stealth dice is performed to define laser scribe lines through the spacer layer between each of the MEMS microphone packages. The MEMS microphone component is coupled to the base layer and electrical interconnects are made after the spacer layer has been bonded to the substrate base and may be done either before or after the stealth dice is performed on the spacer layer. An application specific integrated circuit is formed as an integrated part of the base layer. A first partial saw cut of the base layer and a second partial saw cut of the lid layer are performed after coupling the MEMS microphone component to the base layer. The partial saw cut completely separates the base layer and the lid layer, respectively, along the laser scribe lines in the spacer layer, but does not fully separate the spacer layer. After the partial saw cuts are performed, the MEMS microphone devices are separated by performing a tape expansion to fracture the silicon substrate base layer along the laser scribe lines.

In still another embodiment, the invention provides a method of separating a plurality of MEMS microphone packages from an array of MEMS microphone packages. The array includes a silicon substrate top lid layer, a silicon substrate base layer, and a silicon substrate spacer layer etched to define a plurality of microphone package cavities. An application specific integrated circuit is formed in the base layer in each of the plurality of the microphone package cavities and an acoustic port opening is formed through the base layer in each of the microphone package cavities. A MEMS microphone component is also coupled to the base layer in each of the microphone package cavities. The method of separating the MEMS microphone packages includes performing a stealth dice of the spacer layer to define laser scribe lines. The stealth dice is performed before the MEMS microphone component is coupled to the base layer in each microphone package cavity. After the MEMS microphone components are coupled to the base layer, a first partial saw cut of the base layer and a second partial saw cut of the lid layer are performed. The partial saw cuts completely separate the base layer and the lid layer, respectively, along the laser scribe lines, but do not fully separate the spacer layer. After the partial saw etches are performed, the MEMS microphone devices are separated by performing a tape expansion to fracture the silicon substrate base layer along the laser scribe lines.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1B:
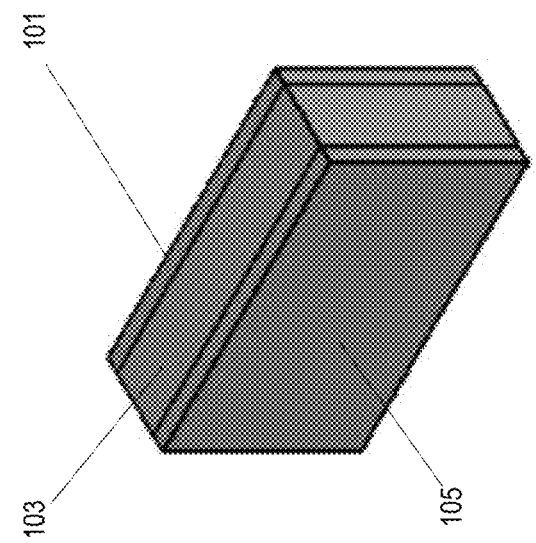
FIG. 1B is another perspective view of the microphone package of FIG. 1A from the opposite side.
Figure 1A:
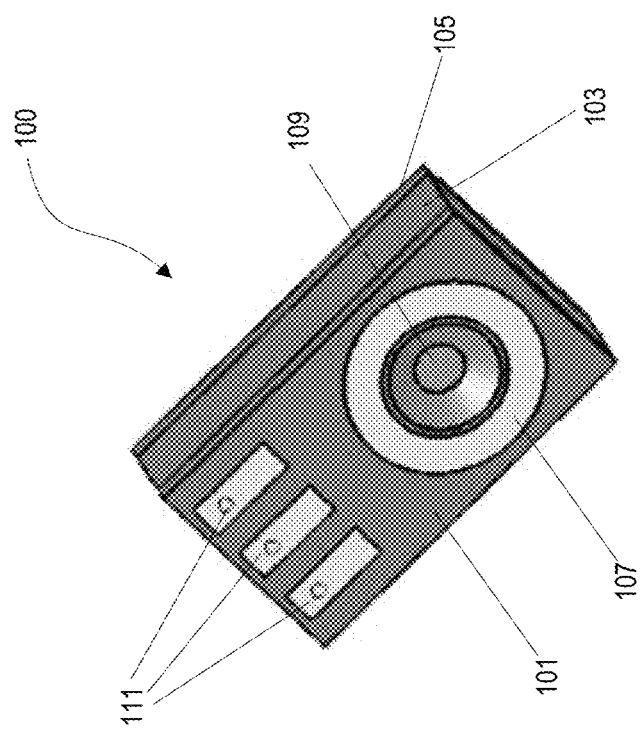
FIG. 1A is a perspective view of a microphone package according to one embodiment.

FIG. 1A shows a first construction of a silicon microphone package 100. The package housing is formed of a silicon substrate base layer 101, a silicon substrate spacer layer 103, and a silicon substrate lid layer 105. As illustrated in further detail below, the spacer layer 103 is at least partially hollowed to form a cavity inside the microphone package housing. A tapered edge 107 is etched around an acoustic port opening 109 in the base layer 101. The tapered edge 107 reduces acoustic impedance as compared to a purely cylindrical acoustic port. A series of three electrical contacts 111 are also positioned on the exterior surface of the base layer 101. As described in further detail below, these contacts 111 provide for electrical signal communication with an application specific integrated circuit (ASIC) that is formed as a integrated part of the base layer 101 and MEMS microphone component that is mounted on an internal surface of the base layer 101.

As shown in FIG. 1B, in this example, no acoustic port openings are formed in the lid layer 105, nor are any electrical contacts, circuit components, or through silicon vias on the lid layer 105. However, in some alternative constructions, an ASIC can be integrated into the silicon substrate of the lid layer 105 instead of (or in addition to) the silicon substrate of the base layer 101. Furthermore, the construction illustrated in FIGS. 1A and 1B is a bottom-ported microphone package. In other "top-ported" microphone packages, the acoustic port opening is formed through the lid layer 105 instead of the base layer 101.

Figure 1D:
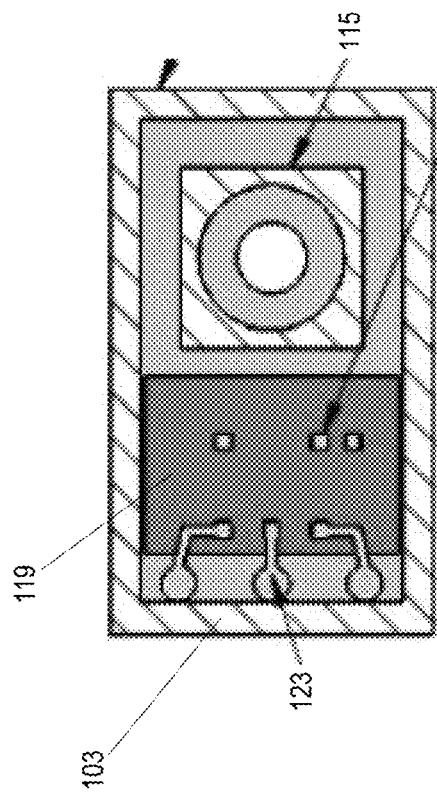
FIG. 1D is a horizontal cross-sectional view of the microphone package of FIG. 1A.
Figure 1E:
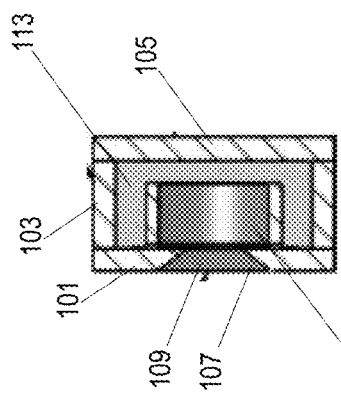
FIG. 1E is a vertical cross-sectional view of the microphone package of FIG. 1A.
Figure 1C:
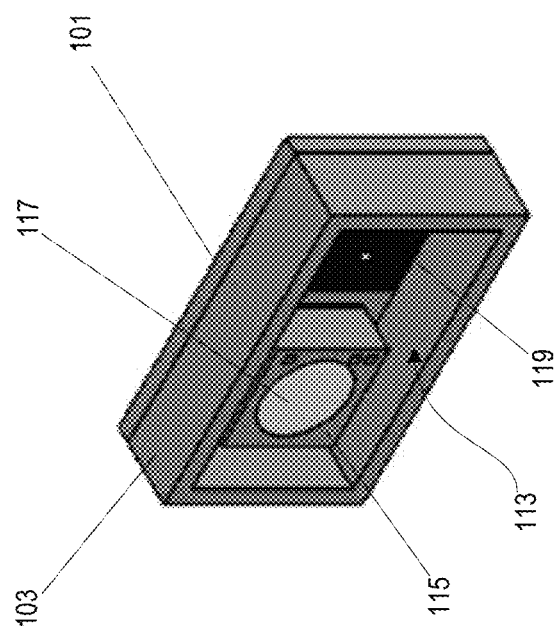
FIG. 1C is a perspective view of the microphone package of FIG. 1B with a lid layer removed.

FIG. 1C shows the microphone package 100 with the lid layer 105 removed to illustrate the arrangement and configuration of components inside the microphone package. As noted above, the spacer layer 103 is etched to form a hollow cavity 113 inside the microphone package 100. A MEMS microphone component 115 is positioned within the cavity 113 and coupled to the base layer 105. The MEMS microphone component 115 in this example includes a diaphragm 117 that physically moves in response to acoustic pressures that enter through the acoustic port opening 109. The movement of the microphone diaphragm 117 causes a change in the capacitance of the microphone component 115. This change in capacitance generates a voltage signal that can be electrically communicated to components outside of the microphone package through the electrical contacts 111.

The ASIC 119 is integrated into the remaining portion of the silicon base layer 101. As illustrated in the cross-sectional view of FIG. 1D, one or more active circuit components 121 are formed in the portion of the base layer substrate 101 containing the ASIC 119. Re-distribution layers (RDLs) are used on the top and bottom surface of the base layer substrate 101 to form the necessary interconnect structures such as wire bond/flip chip bond pads for the MEMS die, connections to the active circuitry, and land pads for the I/O interface on the exterior surface of the base layer substrate 101. In the example of FIG. 1D, a series of electrical traces 123 are also provided on the top (interior) surface of the base layer substrate 101. These traces and electrical interconnects on the interior and exterior surfaces of the base layer substrate are tied together through the use of through-silicon electrical vias (TSVs). Additional routing layers may be added to the top and/or bottom surface of the base layer substrate 101 through traditional silicon processing techniques including, for example, bonded materials such as polyimide routing patches, ultra-thin silicon die, redistribution layers (RDL) or metallization layers used in the integrated circuit fabrication process. These additional routing layers are used to construct passive devices (e.g., resistors, capacitors, inductors, etc.) or for additional space for signal interconnects.

The cross-sectional view of FIG. 1E illustrates the mechanical operation of the MEMS microphone component 115 mounted to the base layer substrate 101 inside the cavity 113 of the microphone package 100. Additional space in the cavity 113 between the MEMS microphone component 115 and the lid layer 105 allows for movement of the microphone diaphragm. Furthermore, as noted above, a tapered edge 107 etched around the acoustic port opening 109 allows for reduced acoustic impedance as acoustic pressures (i.e., sounds) reach the MEMS microphone component 115 through the acoustic port opening 109.

Because the ASIC 119 is integrated directly as part of the base layer 101 of the microphone package, there is no need for mounting hardware between the ASIC and the microphone package housing. Nor is there a need for electrical contact pads to provide for electrical communication between the package housing and a separate ASIC chip. As such, the microphone package 100 illustrated in FIGS. 1A-1D allows for reduced size and/or layout density. Furthermore, a microphone package such as described above provides for new techniques for manufacturing an array of microphone packages in wafer form and separating the individual microphone packages from the wafer array.

Figure 2:
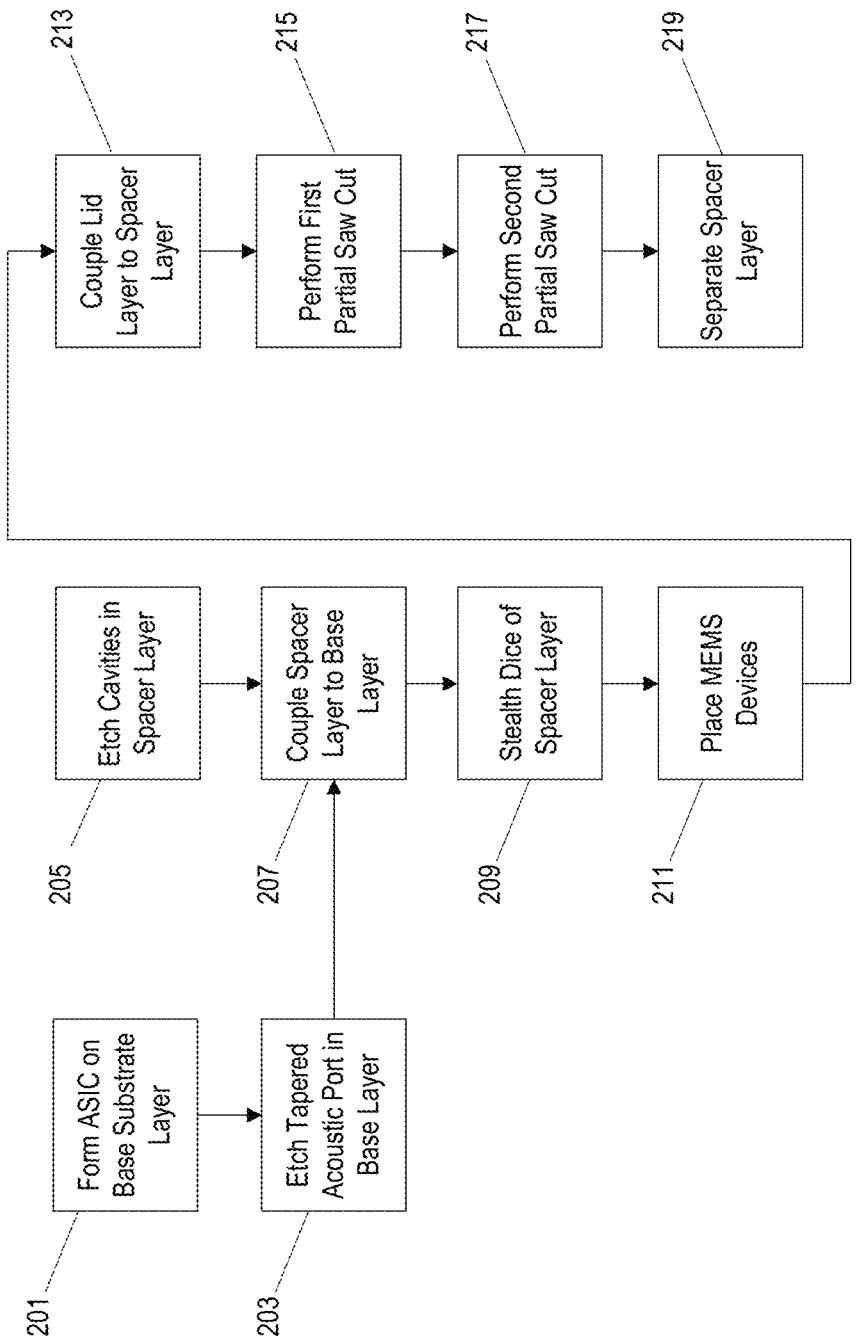
FIG. 2 is a flow chart of a method of manufacturing a plurality of the microphone packages of FIG. 1A.

FIG. 2 illustrates one method of manufacturing a plurality of microphone packages in wafer form. An ASIC is formed for each microphone package in the array on a substrate that will serve as the base layer base (step 201). An acoustic port opening is also etched into base substrate for each microphone package (step 203). A spacer layer substrate is then etched to form the package cavity for each microphone package (step 205). The etched spacer layer substrate is then coupled to the base layer substrate (step 207).

A stealth dice is then performed through the spacer layer (step 209) leaving the base substrate layer intact. The depth of the laser stealth dice is controlled such that lattice disruption is confined to the spacer layer wafer. From this point in the assembly, the substrate wafer provides mechanical structure needed to maintain the packages in an arrayed format suitable for assembly. A MEMS die is then coupled to the base substrate layer in each of the microphone cavities and electrical connections are made to the corresponding ASIC previously built into the base substrate layer (step 211). A lid layer substrate wafer is then placed to seal each individual microphone package cavity (step 213).

Figure 3:
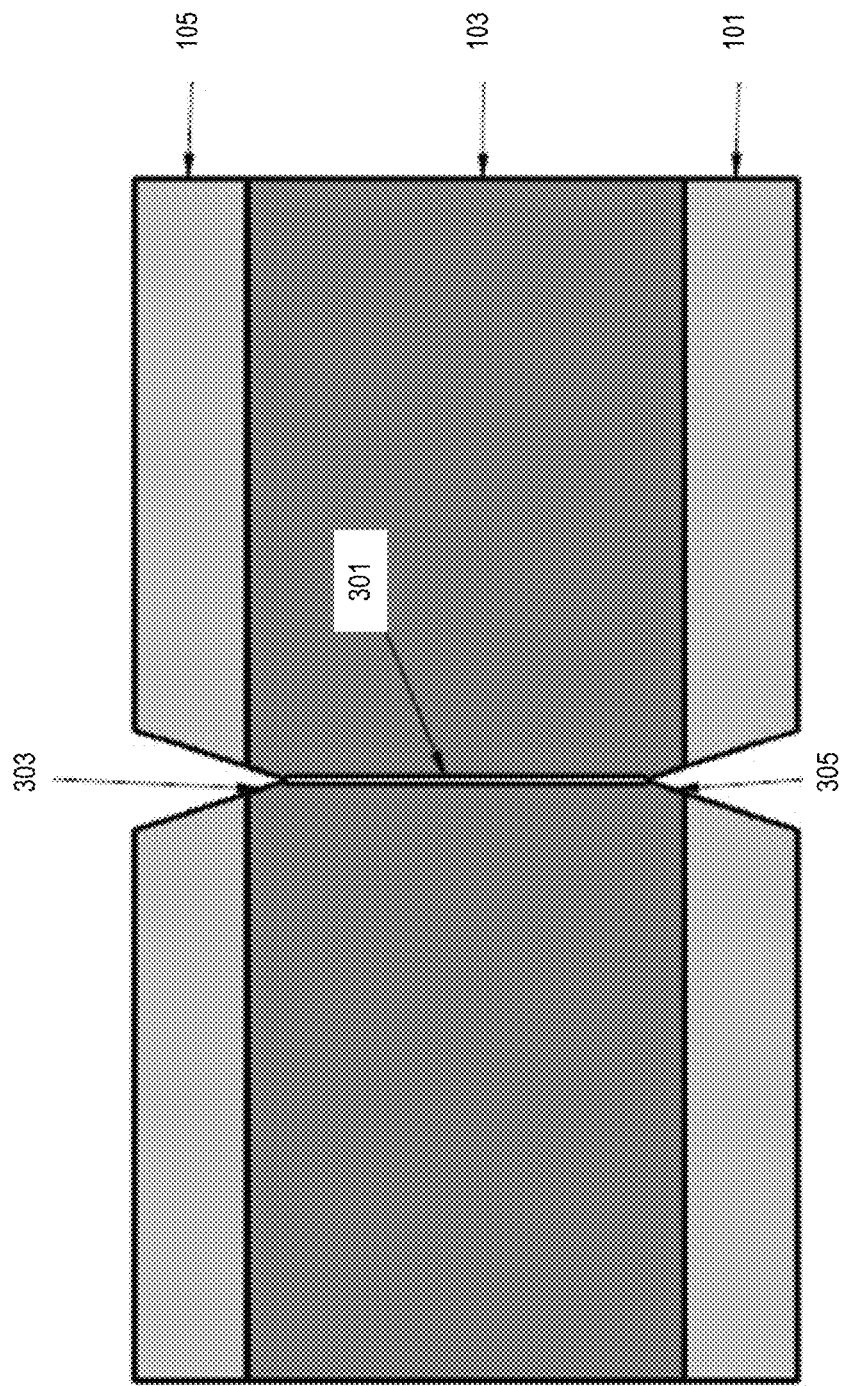
FIG. 3 is an elevation view of an array of microphone packages of FIG. 1A showing the line of separation according to the method of FIG. 2.

After assembly of each package in the array (e.g., spacer wafer, MEMS die, wire bonds, lid wafer), a partial saw cut is performed on the top and bottom surface of the package such that the lid layer and the base layer are singulated leaving only the spacer layer intact. As shown in FIG. 3, the stealth dice (step 209) defines laser scribe lines 301 through the spacer layer 103 between each microphone package in the array. A first partial saw cut (step 215) cuts the lid layer 105 along the same pattern as the laser scribe lines 301. A second partial saw cut (step 217) also cuts the base layer 101 along the same pattern as the laser scribe lines 301. As shown in FIG. 3, the first partial saw pass 303 cuts completely through the lid layer 105 and partially through the spacer layer 103. Similarly, the second partial saw pass 305 cuts completely through the base layer 101 and partially through the spacer layer 103. After the partial saw cuts are completed, separation of the spacer layer 103 is achieved through tape expansion (step 219) to fracture the package along the laser scribe lines that were made earlier (i.e., during step 209).

The examples described above provide a bottom-ported microphone package. However, as noted above, other configurations are possible. For example, a top-ported microphone package can be assembled by a process similar to the one illustrated in FIG. 2. However, in the top-ported construction, patterned silicon wafers are used on both the top and bottom layers of the package (i.e., the base layer 101 and the lid layer 105). One or more through-silicon vias (TSVs) are formed through the spacer layer to make electrical connection between the lid layer and the base layer of the package. The MEMS device in some top-ported constructions is mounted on the internal surface of the lid layer while portions of the ASIC are formed in both the lid layer and the base layer as required by the specific details of the package design and the microphone functionality provided by the ASIC.

Figure 4:
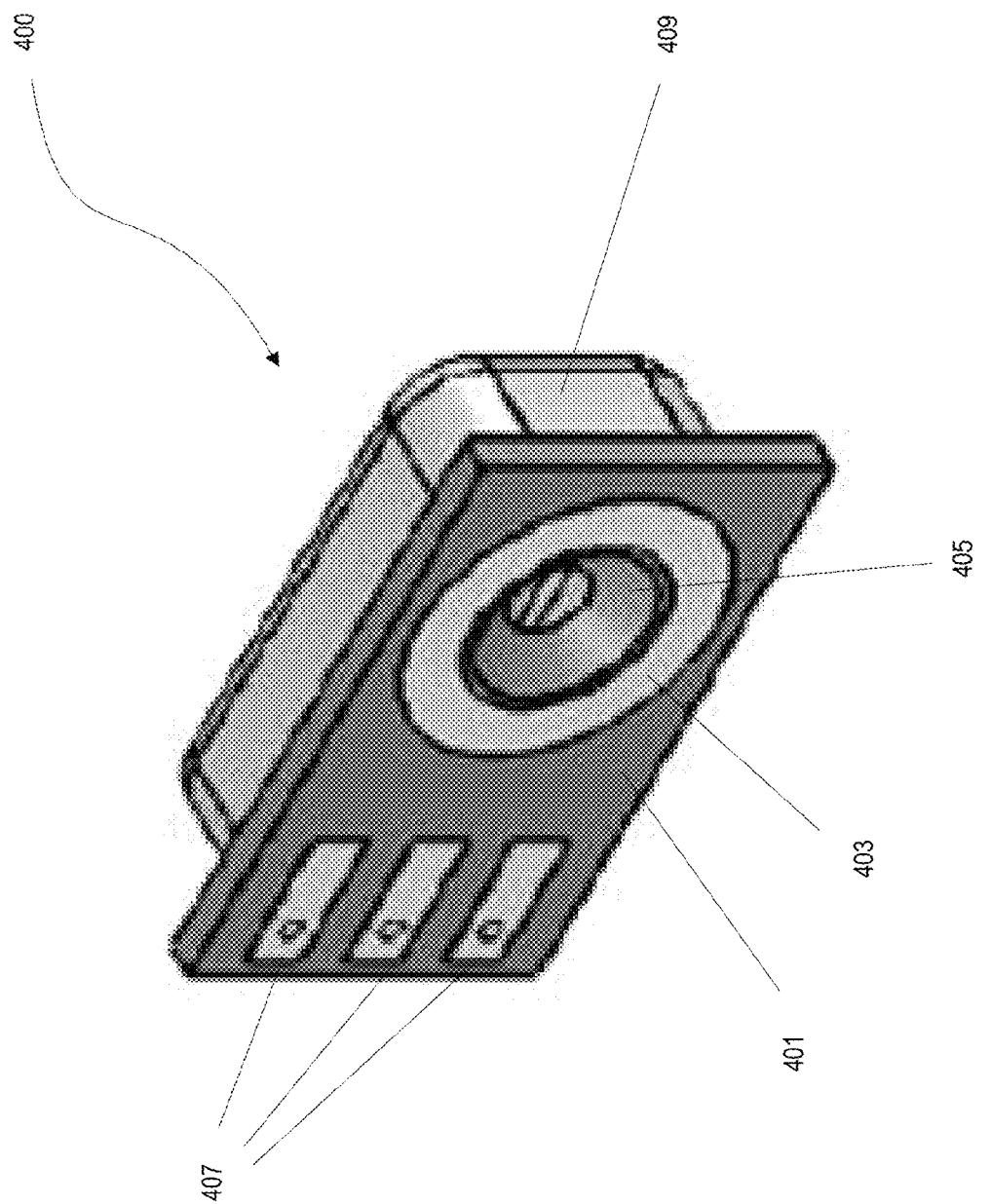
FIG. 4 is a perspective view of a microphone package according to another embodiment.

Furthermore, in the examples discussed above, the microphone packages are formed by etching silicon layers to form a cavity. However, in other constructions, discrete lid components can be mounted directly to the base substrate layer to form the cavity. One such construction is illustrated in FIG. 4. The base layer 401 of the microphone package 400 is much the same as the base layer 101 illustrated in FIG. 1A above. A tapered edge 403 is etched around an acoustic port opening 405 that is formed through the base layer 401. A series of electrical contacts 407 provide for electrical communication with an ASIC that is integrated into the silicon substrate of the base layer 401. However, instead of including an etched spacer layer and a silicon lid layer to form the cavity on the interior surface of the base layer 401, a separate lid component 409 is coupled to the rear surface of the base substrate layer 401 to define a cavity.

Also like the constructions described above, the microphone package 400 of FIG. 4 can be formed as an array of microphone packages on a single wafer. However, because only a single layer needs to be singulated (i.e., the base layer 401), stealth dicing can be performed to extract individual units from the assembly array. Because this type of dicing requires a near-zero width saw street, the overall package size and the array size can be significantly reduced by eliminating the need to maintain clearances (i.e., the saw street or dicing street) between the individual components in the array wafer.

Thus, the invention provides, among other things, a MEMS microphone device package with an ASIC integrated into the base substrate of the microphone package as well as method of manufacturing such microphone packages and separating individual microphone packages from an assembly array. Various features and advantages of the invention are set forth in the following claims.

What is claimed is:

1. A microelectromechanical system (MEMS) microphone package comprising:
    a base substrate layer including an acoustic port opening and an application specific integrated circuit formed as an integrated part of the base substrate layer;
    a lid coupled to the base substrate layer forming a package cavity between the base substrate layer and the lid; and
    a MEMS microphone component positioned within the package cavity and configured to receive acoustic pressures through the acoustic port opening in the base substrate layer, the MEMS microphone being electronically coupled to the application specific integrated circuit of the base substrate layer,
    wherein the base substrate layer further includes a tapered edge on an exterior surface of the base substrate layer around the acoustic port opening.

2. The MEMS microphone package of claim 1, further comprising one or more electrical signal contacts on an external surface of the base substrate layer, wherein the one or more electrical signal contacts provide for electrical communication with the application specific integrated circuit.

3. The MEMS microphone package of claim 1, wherein the lid includes a formed lid component that is coupled to the base substrate layer.

4. A microelectromechanical system (MEMS) microphone package comprising:
    a base substrate layer including an acoustic port opening and an application specific integrated circuit formed as an integrated part of the base substrate layer;
    a lid coupled to the base substrate layer forming a package cavity between the base substrate layer and the lid; and
    a MEMS microphone component positioned within the package cavity and configured to receive acoustic pressures through the acoustic port opening in the base substrate layer, the MEMS microphone being electronically coupled to the application specific integrated circuit of the base substrate layer,
    wherein the lid includes a top lid substrate layer and a spacer layer, wherein the spacer layer is at least partially hollow and is coupled between the top lid substrate layer and the base substrate layer to form a sealed package cavity between the base substrate layer and the top substrate layer.

5. The MEMS microphone package of claim 4, wherein the base substrate layer, the spacer layer, and the top lid substrate layer are all formed of silicon-based materials.

6. The MEMS microphone package of claim 4, further comprising one or more electrical signal contacts on an external surface of the base substrate layer, wherein the one or more electrical signal contacts provide for electrical communication with the application specific integrated circuit.

* * * * *